US00RE48341E

(19) United States
(12) Reissued Patent
Oh et al.

(10) Patent Number: US RE48,341 E
(45) Date of Reissued Patent: Dec. 1, 2020

(54) SEMICONDUCTOR MEMORY DEVICE AND DRIVING METHOD THEREOF

(71) Applicant: Conversant Intellectual Property Management Inc., Ottawa (CA)

(72) Inventors: Young-Hoon Oh, Gyeonggi-do (KR); Kwang-Myoung Rho, Kyoungki-do (KR)

(73) Assignee: Conversant Intellectual Property Management Inc., Ottawa (CA)

(21) Appl. No.: 14/100,793

(22) Filed: Dec. 9, 2013

(65) Prior Publication Data

US 2014/0098621 A1 Apr. 10, 2014

Related U.S. Patent Documents

Reissue of:
(64) Patent No.: 7,746,723
Issued: Jun. 29, 2010
Appl. No.: 12/354,158
Filed: Jan. 15, 2009

U.S. Applications:
(63) Continuation of application No. 13/538,130, filed on Jun. 29, 2012, now Pat. No. Re. 44,632, which is an
(Continued)

(30) Foreign Application Priority Data

Jun. 29, 2009 (KR) ..... 10-2006-0059735

(51) Int. Cl.
*G11C 7/00* (2006.01)
*G11C 11/4076* (2006.01)
(Continued)

(52) U.S. Cl.
CPC ..... *G11C 11/4076* (2013.01); *G11C 7/1051* (2013.01); *G11C 7/1069* (2013.01);
(Continued)

(58) Field of Classification Search
CPC ... G11C 7/1051; G11C 7/1066; G11C 7/1069; G11C 7/1093; G11C 7/22; G11C 7/222;
(Continued)

(56) References Cited

U.S. PATENT DOCUMENTS 6,108,793 A * 8/2000 Fujii ..... G01R 31/3016 713/400
6,489,819 B1 * 12/2002 Kono ..... G11C 29/14 327/141
(Continued)

FOREIGN PATENT DOCUMENTS

KR 10-2005-0020359 3/2005
KR 10-2005-0048755 5/2005
KR 10-2005-0109813 11/2005

*Primary Examiner* — Samuel G Rimell
(74) *Attorney, Agent, or Firm* — Conversant IP Management

(57) ABSTRACT

A semiconductor memory device includes: a variable delay for delaying a delay locked loop (DLL) clock by a predetermined delay time to output a delayed DLL clock; an output driver for outputting data and data strobe signal in response to the delayed DLL clock; and a calibration controller for controlling the predetermined delay time of the variable delay in response to output AC parameters.

9 Claims, 4 Drawing Sheets

Related U.S. Application Data application for the reissue of Pat. No. 7,746,723, which is a continuation of application No. 11/647,402, filed on Dec. 29, 2006, now Pat. No. 7,489,586.

(51) Int. Cl.

| | |
|---|---|
| ***G11C 7/10*** | (2006.01) |
| ***G11C 29/02*** | (2006.01) |
| ***G11C 7/22*** | (2006.01) |
| *G11C 11/401* | (2006.01) |

(52) U.S. Cl.

CPC ..... *G11C 7/22* (2013.01); *G11C 7/222* (2013.01); *G11C 29/02* (2013.01); *G11C 29/023* (2013.01); *G11C 29/028* (2013.01); *G11C 11/401* (2013.01); *G11C 2207/2254* (2013.01)

(58) Field of Classification Search

CPC . G11C 7/225; G11C 11/2293; G11C 11/4076; G11C 29/02; G11C 29/023; G11C 29/028; G11C 11/401; G11C 2207/2254; G05B 2219/34001; G11B 20/1024; G06F 9/381; H03C 3/0908; H03C 1/2236; H03C 1/2254; H03C 3/0983; H03L 7/06

USPC ..... 365/233.1, 194, 189.05, 199, 193; 327/156, 158

See application file for complete search history.

(56) References Cited

U.S. PATENT DOCUMENTS

| | | | | |
|---|---|---|---|---|
| 6,519,188 | B2 * | 2/2003 | Ryoo | G06F 5/06 365/189.05 |
| 6,552,587 | B2 * | 4/2003 | Kim | G11C 7/1051 327/158 |
| 6,859,404 | B1 | 2/2005 | Kim | |
| 6,990,042 | B2 * | 1/2006 | Stark | 365/233.1 |
| 6,996,026 | B2 | 2/2006 | Brox et al. | 365/233.1 |
| 7,171,321 | B2 * | 1/2007 | Best | G06F 13/1689 702/106 |
| 7,489,586 | B2 * | 2/2009 | Oh et al. | 365/233.1 |
| 7,746,723 | B2 * | 6/2010 | Oh et al. | 365/233.1 |
| 8,121,237 | B2 * | 2/2012 | Stott | G11C 7/1051 365/193 |
| 8,228,747 | B2 * | 7/2012 | Onishi | 365/194 |
| 2002/0091958 | A1 * | 7/2002 | Schoenfeld | G06F 1/10 713/401 |
| 2006/0176761 | A1 * | 8/2006 | Lee | G11C 7/1072 365/233.1 |

* cited by examiner

SEMICONDUCTOR MEMORY DEVICE AND DRIVING METHOD THEREOF

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

RELATED APPLICATIONS

[This application] *More than one reissue application has been filed for the reissue of U.S. Pat. No. 7,746,723. This application is a Continuation Reissue of U.S. patent application Ser. No. 13/538,130, filed Jun. 29, 2012, reissued as U.S. Pat. No. RE44,632 on Dec. 10, 2013, which is a Reissue of U.S. patent application Ser. No. 12/354,158, filed Jan. 15, 2009, originally issued as U.S. Pat. No. 7,746,723 on Jun. 29, 2010, which* is Continuation of U.S. application Ser. No. 11/647,402, filed on Dec. 29, 2006 and issued as U.S. Pat. No. 7,489,586 on Feb. 10, 2009, claiming priority of Korean Application No. 10-2006-0059736 filed on Jun. 29, 2006, the entire contents of each of which are hereby incorporated by reference.

FIELD OF THE INVENTION

The present invention relates to a semiconductor memory device, and more particularly, to a synchronous semiconductor device and a method for controlling output AC parameters thereof.

DESCRIPTION OF RELATED ART

A synchronous semiconductor memory device shares a system clock output from a clock generator with a chipset and receives or transfers command, address and data in synchronization with the system clock.

FIG. 1 is a block diagram of a communication scheme between a synchronous dynamic random access memory (DRAM) and a chipset.

In a write operation, the chipset transfers command CMD, address ADD, and data DQ to the DRAM. The chipset also transfers a data strobe signal DQS to the DRAM together with the data DQ.

In a read operation, the DRAM receives the command CMD and the address ADD from the chipset and transfers the corresponding data DQ to the chipset together with the data strobe signal DQS.

The chipset transfers the data strobe signal DQS to the DRAM in the write operation, while the DRAM transfers the data strobe signal DQS to the chipset in the read operation.

The data strobe signal DQS is used for source synchronization and is also called "echo clock". If the data DQS is strobed in synchronization with the data strobe signal DQS, skew between the clock CLK and the data DQS can be reduced.

FIG. 2 is a diagram relating AC parameters in a read operation of a DDR SDRAM.

Timing of data DQ and data strobe signal DQS is illustrated in FIG. 2. In FIG. 2, "tDQSQ" is a parameter representing skew between the data strobe signal DQS and the data DQ, "tDQSCK" is a parameter representing skew between the data strobe signal DQS and clock CLK, and "tAC" is a parameter representing skew between the data DQ and the clock CLK.

In order to enable a chipset to receive the data DQ, a DRAM sets the data strobe signal DQS to a low-Z state during tRPRE (read DQS preamble time) . When data (DQ) transmission is completed, the DRAM sets the data strobe signal DQS to a high-Z state after tRPST (read DQS postamble time). In this manner, the read operation is completed.

If any one of the above-described parameters does not meet the specification, operation error will occur because the chipset receives incorrect data. However, the conventional DRAM module and chipset do not actively control the output AC parameters, e.g., tDQSQ, tDQSCK, etc. Thus, the system will shut down when the output AC parameters are distorted by fluctuation of a board power supply or ambient temperature characteristic. Moreover, as the operation speed of the DRAM increases, the specification requirements of the output AC parameters become narrower. Consequently, the development of high-speed DRAMs becomes increasingly more difficult.

SUMMARY OF THE INVENTION

It is, therefore, an object of the present invention to provide a semiconductor memory device that can actively control the output AC parameters, and a driving method thereof.

In accordance with an aspect of the present invention, a semiconductor memory device includes: a variable delay for delaying a delay locked loop (DLL) clock by a predetermined delay time to output a delayed DLL clock; an output driver for outputting data and data strobe signal in response to the delayed DLL clock; and a calibration controller for controlling the predetermined delay time of the variable delay in response to output AC parameters.

In accordance with another aspect of the present invention, a method for driving a semiconductor memory device includes: measuring output AC parameters; setting a delay value with respect to a delay locked loop (DLL) clock in response to the measured values of the output AC parameters; delaying the DLL clock by the delay value to output a delayed DLL clock; and outputting data strobe signal and data having calibrated output AC parameters in response to the delayed DLL clock.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A semiconductor memory device and a driving method thereof in accordance with exemplary embodiments of the present invention will be described in detail with reference to the accompanying drawings.

Figure 1:
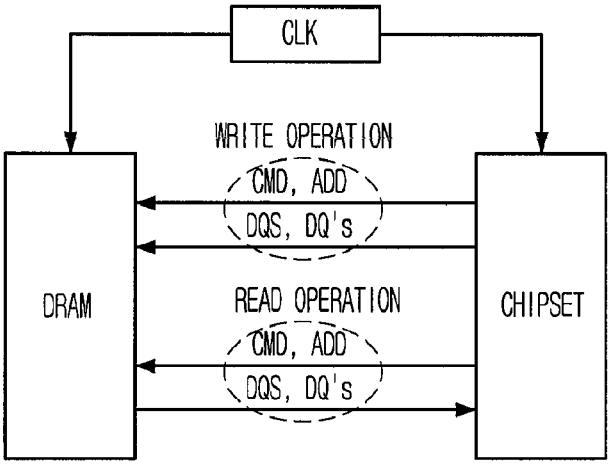
FIG. 1 (RELATED ART)
FIG. 1 is a block diagram of a communication scheme between a Synchronous DRAM and a chipset.
Figure 2:
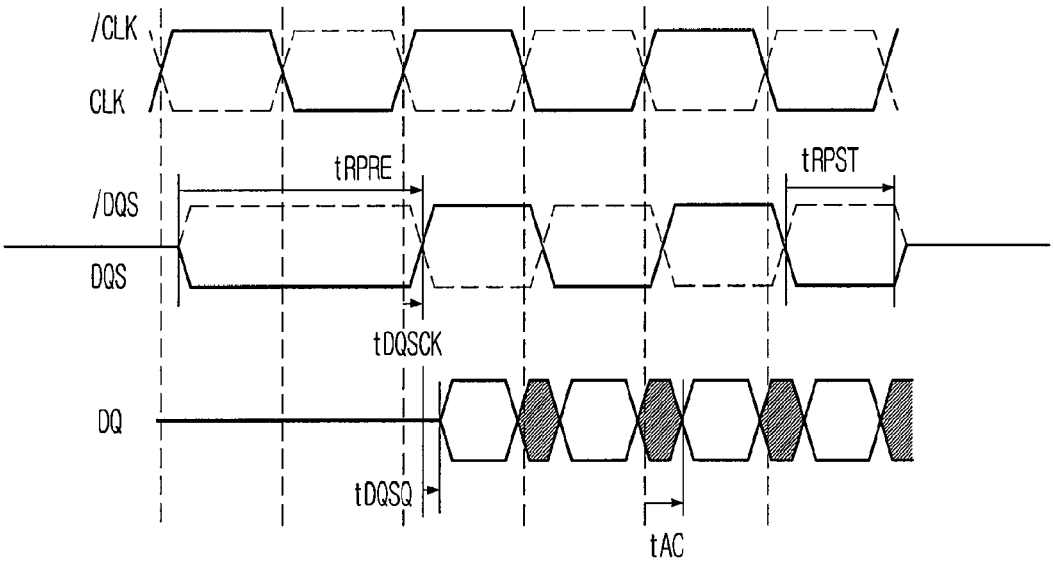
FIG. 2 (RELATED ART)
FIG. 2 is a diagram relating AC parameters in a read operation of a DDR SDRAM.
Figure 3:
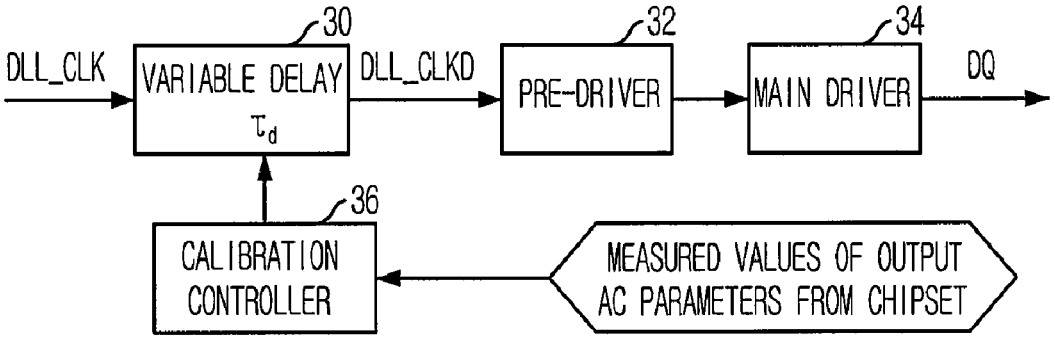
FIG. 3 is a block diagram of a DRAM in accordance with a first embodiment of the present invention.

FIG. 3 is a block diagram of a DRAM in accordance with a first embodiment of the present invention.

The DRAM in accordance with the first embodiment of the present invention includes a variable delay 30, a pre-driver 32, a main driver 34, and a calibration controller 36. The variable delay 30 delays a delay locked loop (DLL) clock DLL_CLK to output a delayed DLL clock DLL_CLKD, and the pre-driver 32 pre-drives an output data signal in response to the delayed DLL clock DLL_CLKD. The main driver 34 drives a data output terminal DQ in response to an output signal of the pre-driver 32. The calibration controller 36 controls a delay time ($\tau_d$) of the variable delay 30 in response to measured values of output AC parameters. The measured values of the output AC parameters are received from a chipset.

Figure 4:
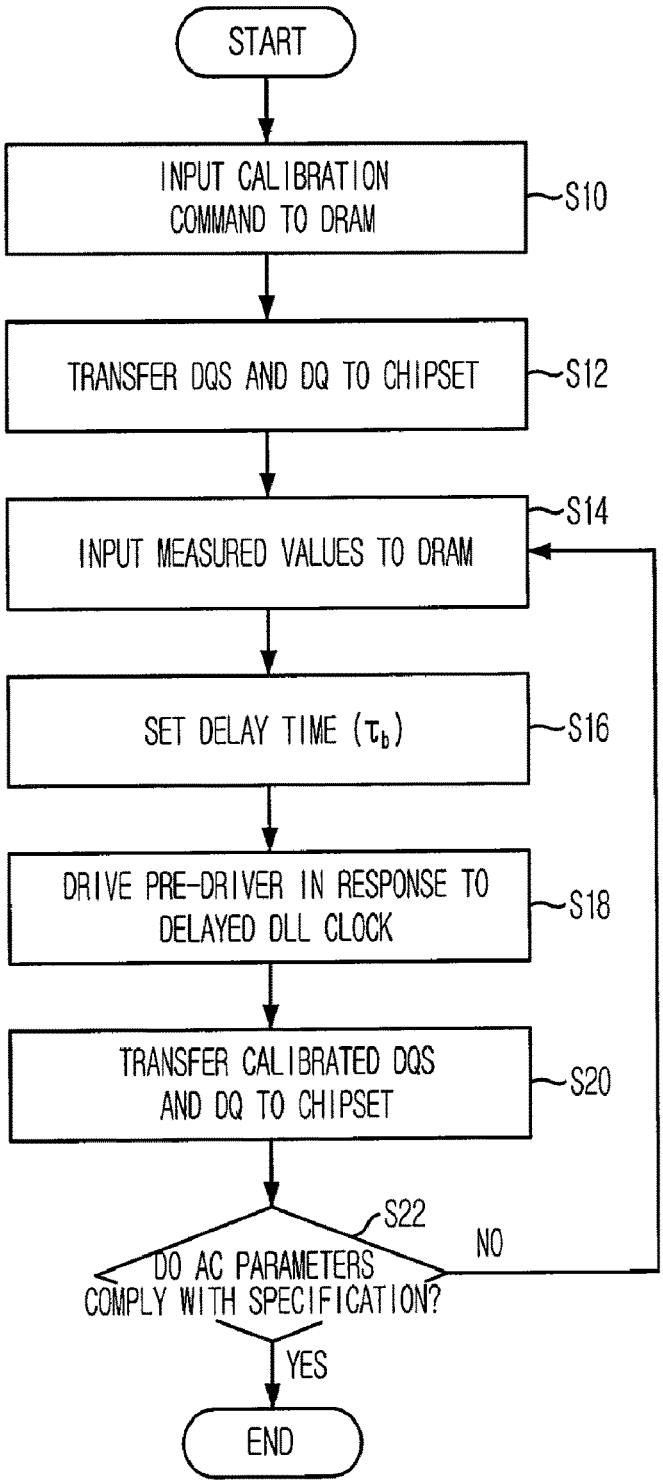
FIG. 4 is a flow chart of a calibration operation of the DRAM of FIG. 3.

FIG. 4 is a flow chart of a calibration operation of the DRAM of FIG. 3.

When the chipset inputs a calibration command to the DRAM in step S10, the DRAM transfers data strobe signal DQS and data DQ to the chipset in step S12.

In step S14, the chip set measures the output AC parameters (e.g., tDQSCK, tDQSQ, etc.) in the data strobe signal DQS and the data DQ, and transfers the measured values of the output AC parameters to the DRAM. In step S16, the calibration controller 36 sets the delay time ($\tau_d$) of the variable delay 30 in response to the measured values.

In this case, the variable delay 30 delays the DLL clock DLL_CLK by $+\tau_d$ or $-\tau_d$, and the pre-driver 32 is driven in response to the delayed DLL clock DLL_CLKD in step S18. In step S20, the calibrated data strobe signal DQS and the calibrated data DQ are transferred to the chipset.

In step S22, the chipset remeasures the output AC parameters, based on the calibrated data strobe signal DQS and the calibrated data DQ, and determines if the AC parameters comply with the specification. When the AC parameters comply with the specification, the calibration operation is completed. When the AC parameters do not comply with the specification, the process returns to step S14 to transfer the remeasured values to the DRAM. This loop is repeated until the AC parameters comply with the specification. Since steps subsequent to step S22 are a verify operation, they can be omitted.

Figure 5:
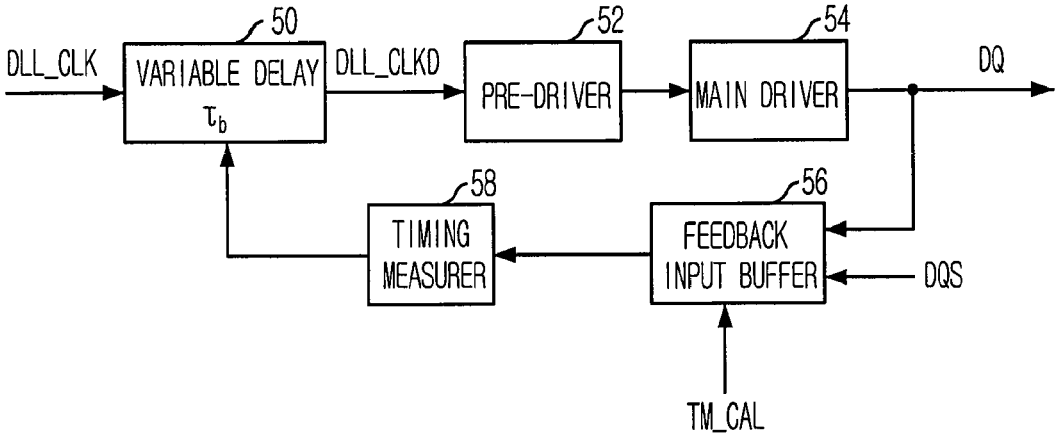
FIG. 5 is a block diagram of a DRAM in accordance with a second embodiment of the present invention.

FIG. 5 is a block diagram of a DRAM in accordance with a second embodiment of the present invention.

The DRAM in accordance with the second embodiment of the present invention includes a variable delay 50, a pre-driver 52, a main driver 54, a feedback input buffer 56, and a timing measurer 58. The variable delay 50 delays a DLL clock DLL_CLK to output a delayed DLL clock DLL_CLKD, and the pre-driver 52 pre-drives an output data signal in response to the delayed DLL clock DLL_CLKD. The main driver 54 drives a data output terminal DQ in response to an output signal of the pre-driver 52. The feedback input buffer 56 feeds back data DQ and data strobe signal DQS to the timing measurer 58 in response to a calibration test mode signal TM_CAL. The timing measurer 58 measures output AC parameters (e.g., tDQSCK, tDQSQ, etc.) of the data DQ and the data strobe signal DQS, and controls the delay time ($\tau_d$) of the variable delay 30 in response to the measurement values of the output AC parameters.

When a calibration command is input from the chipset, the DRAM activates the calibration test mode signal TM_CAL in response to the calibration command. When the calibration test mode signal TM_CAL is activated, the feedback input buffer 56 is enabled to receive the data DQ and the data strobe signal DQS. The timing measurer 58 measures skew between the data DQ and the data strobe signal DQS and controls the delay time ($\tau_d$) of the DLL clock DLL_CLK according to the measured skew. When the calibration test mode signal TM_CAL is deactivated after the calibration operation is completed, the DRAM transfers a calibration test mode exit signal to the chipset.

Figure 6:
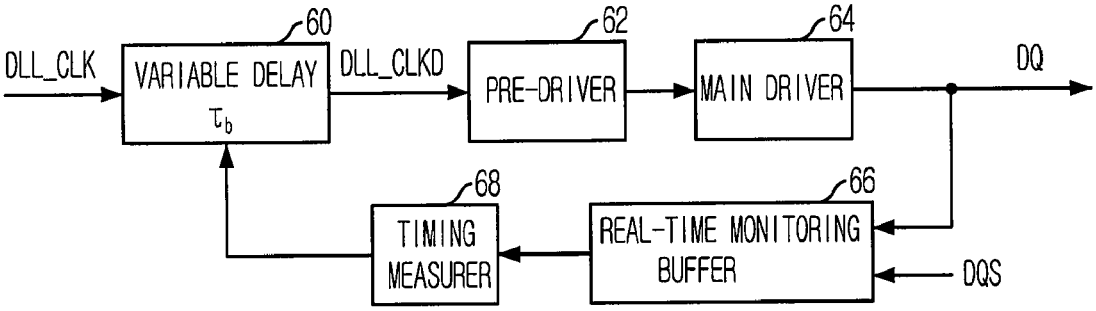
FIG. 6 is a block diagram of a DRAM in accordance with a third embodiment of the present invention.

FIG. 6 is a block diagram of a DRAM in accordance with a third embodiment of the present invention.

The DRAM in accordance with the third embodiment of the present invention includes a variable delay 60, a pre-driver 62, a main driver 64, a real-time monitoring buffer 66, and a timing measurer 68. The variable delay 60 delays a DLL clock DLL_CLK to output a delayed DLL clock DLL_CLKD, and the pre-driver 62 pre-drives an output data signal in response to the delayed DLL clock DLL_CLKD. The main driver 64 drives a data output terminal DQ in response to an output signal of the pre-driver 62. The real-time monitoring buffer 66 monitors data DQ and data strobe signal DQS, which is being transferred to the chipset. The timing measurer 68 measures output AC parameters (e.g., tDQSCK, tDQSQ, etc.) in data DQ and data strobe signal DQS received from the real-time monitoring buffer 66, and controls the delay time ($\tau_d$) of the variable delay 60 in response to the measured values.

In this embodiment, the DRAM itself performs the calibration without calibration command provided from the chip set. Although the real-time monitoring buffer 66 must be embedded into the DRAM, it is possible to omit time taken to perform the calibration through the communication between the DRAM and the chipset.

If undesired skew occurs during the operation of the DRAM, the skew can be immediately adjusted to meet the specification without time loss because the DRAM monitors the skew in real time.

As described above, the embodiments of the present invention provide the timing control methods that can actively adjust the output AC parameters in the memory device. In the first method, the chipset transfers the calibration command and the measured values of the output AC parameters to the memory device, and the memory device performs the calibration operation. In the second method, when the chipset transfers the calibration command to the memory device, the memory device measures the output AC parameters and performs the calibration operation. In the third method, the memory device transfers the data strobe signal DQS and the data DQ to the chipset while monitoring them in real time, without calibration command of the chipset.

Therefore, the memory device can actively control the output AC parameters, thus providing the decreased failure rate and the improved reliability. In addition, the memory device can cope with the narrowed specification requirements of the AC parameters, attributing to the developments of high-speed memory devices.

Although the DRAM has been described, the present invention is not limited to the DRAM. That is, the present invention can also be applied to any memory device that communicates the chipset using data strobe signal.

The present application contains subject matter related to Korean patent application No. 2006-59735, filed in the Korean Intellectual Property Office on Jun. 29, 2006, the entire contents of which are incorporated herein by reference.

While the present invention has been described with respect to certain preferred embodiments, it will be apparent to those skilled in the art that various changes and modifications may be made without departing from the scope of the invention as defined in the following claims.

What is claimed is:

[1. A semiconductor memory device, comprising:

a variable delay configured to delay a clock;

an output driver configured to transfer data to a chipset in response to a calibration command received from the chipset and the delayed clock;

an output buffer configured to transfer a data strobe signal to the chipset in response to the calibration command and the delayed clock; and a calibration controller configured to control the delay time of the variable delay according to output AC parameters measured by the chipset.]

[2. The semiconductor memory device of claim 1, wherein the output driver comprises:

a pre-driver configured to pre-drive an output data signal; and a main driver configured to drive a data output terminal in response to an output signal of the pre-driver.]

[3. The semiconductor memory device of claim 1, wherein the output AC parameters include at least one of a parameter representing skew between the data strobe signal and the data, a parameter representing skew between the data strobe signal and a clock, and a parameter representing skew between the data and the clock.]

[4. A semiconductor memory device, comprising:

a variable delay configured to delay a clock;

an output driver configured to receive and output data in response to the delayed clock; and a calibration controller configured to measure AC parameters of data and data strobe signal received from a chipset in response to a calibration command received from the chipset, and control the delay time of the variable delay according to measured values of the output AC parameters.]

[5. The semiconductor memory device of claim 4, wherein the calibration controller comprises:

a feedback input buffer configured to feed back the data and the data strobe signal, which are transferred to the chipset, in response to a calibration test mode signal generated when the calibration command is received; and a timing measurer configured to receive the data and the data strobe signal from the feedback input buffer, measure the AC parameters of data and data strobe signal, and control the delay time of the variable delay according to measured values of the output AC parameters.]

[6. The semiconductor memory device of claim 4, wherein the calibration controller comprises:

a real-time monitor configured to monitor the data and the data strobe signal being transferred to the chipset; and a timing measurer configured to receive the data and the data strobe signal from the real-time monitor, measure the AC parameters of data and data strobe signal, and control the delay time of the variable delay according to measured values of the output AC parameters.]

[7. The semiconductor memory device of claim 4, wherein the output driver comprises:

a pre-driver configured to pre-drive an output data signal; and a main driver configured to drive a data output terminal in response to an output signal of the pre-driver.]

[8. The semiconductor memory device of claim 4, wherein the output AC parameters include at least one of a parameter representing skew between the data strobe signal and the data, a parameter representing skew between the data strobe signal and the clock, and a parameter representing skew between the data and the clock.]

[9. A method for driving a semiconductor memory device, comprising:

receiving a calibration command from a chipset;

transferring a first data and a first data strobe signal to the chipset in response to the calibration command;

receiving measured values of output AC parameters from the chipset, wherein the measured values of output AC parameters are measured at the chipset by using the data and the data strobe signal;

setting a delay value with respect to a clock in response to the measured values of the output AC parameters;

delaying the clock by the delay value to output a delayed clock; and transferring a second data and a second data strobe signal having calibrated output AC parameters to the chipset in response to the delayed clock.]

[10. The method of claim 9, further comprising:

after transferring the second data and the second data strobe signal, remeasuring the output AC parameters at the chipset based on the second data and the second data strobe signal having the calibrated output AC parameters; and when the remeasured output AC parameters comply with a specification, completing a calibration operation.]

[11. A method for driving a semiconductor memory device, comprising:

receiving a calibration command from a chipset;

receiving a first data and a first data strobe signal from the chipset;

measuring AC parameters of the first data and the first data strobe signal in response to the calibration command;

controlling the delay time of a clock according to measured values of the AC parameters; and transferring a second data and a second data strobe signal having calibrated output AC parameters to the chipset in response to the delayed clock.]

*12. A memory system including a dynamic access memory and control system, the control system comprising:*

*a variable delay unit for delaying a clock signal by a predetermined delay time to output a delayed clock signal;*

*an output driver for transferring data and a data strobe signal in response to the delayed clock signal; and*

*a calibration controller for controlling the predetermined delay time of the variable delay according to at least one output AC parameter, wherein the calibration controller comprises:*

*a real-time monitoring buffer for monitoring the data and the data strobe signal; and*

*a timing measurer for receiving the data and the data strobe signal from the real-time monitoring buffer and calibrating the predetermined delay time by measuring the at least one output AC parameter and controlling said measured AC parameter.*

*13. The memory system of claim 12, wherein the calibration controller controls the predetermined delay time according to measured values of the output AC parameters.*

*14. The memory system of claim 12, wherein the output driver comprises: a pre-driver for pre-driving an output data signal; and a main driver for driving a data output terminal in response to an output signal of the pre-driver.*

*15. The memory system of claim 12, wherein the calibration controller is configured to receive the at least one output AC parameter, the at least one output AC parameter comprising at least one of a parameter representing skew between a data strobe signal and the data, a parameter representing skew between the data strobe signal and a clock, and a parameter representing skew between the data and the clock.*

*16. A method for driving a memory system, the system including a dynamic access memory and at least one signal driver outputting data strobe signals and data signals, the method comprising:*

*receiving a calibration command from a chipset;*

*receiving a first data strobe signal and a first data signal from the chipset;*

*measuring at least one output AC parameter from one of the data strobe signal and data signal;*

*setting a delay value with respect to a DLL clock signal in response to the measured values of the at least one output AC parameter;*

*delaying the DLL clock signal by the delay value to output a delayed clock signal to the chipset; and*

*transferring a second data strobe signal and a second data signal having a calibrated at least one output AC parameter to the chipset in response to the delayed clock signal,*

*wherein the measuring of the at least one output AC parameter comprises:*

*generating a calibration test mode signal in response to a calibration command;*

*feeding back the data and the data strobe signal in response to the calibration test mode signal; and*

*measuring the at least one output AC parameter by using the fed-back data strobe signal and the fed-back data.*

*17. The method of claim 16, wherein the measuring the at least one output AC parameter includes:*

*transmitting the data and the data strobe signal in response to the calibration command; and*

*receiving the at least one output AC parameter measured by using the data strobe signal and the data.*

*18. The method of claim 16, further comprising completing a calibration operation when the at least one output AC parameter based on the data and the data strobe signal having the calibrated at least one output AC parameter complies with a specification.*

*19. The method of claim 17, further comprising returning to the step of receiving of the at least one output AC parameter when the at least one output AC parameter, based on the data and the data strobe signal having the calibrated at least one output AC parameter, does not comply with a specification.*

*20. The method of claim 17, wherein when receiving the at least one output AC parameter, the at least one output AC parameter comprises at least one of a parameter representing skew between the data strobe signal and the data, a parameter representing skew between the data strobe signal and a clock, and a parameter representing skew between the data and the clock.*

* * * * *